United States Patent
Kirchner et al.

(10) Patent No.: US 7,605,905 B2
(45) Date of Patent: Oct. 20, 2009

(54) METHOD FOR DISTORTION CORRECTION IN A MICROLITHOGRAPHIC PROJECTION EXPOSURE APPARATUS

(75) Inventors: Andreas Kirchner, Lorch (DE);
Bernhard Kneer, Altheim (DE);
Hans-Jürgen Mann, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 22 days.

(21) Appl. No.: 12/107,879

(22) Filed: Apr. 23, 2008

(65) Prior Publication Data

US 2008/0278699 A1 Nov. 13, 2008

Related U.S. Application Data

(63) Continuation of application No. 10/815,116, filed on Mar. 31, 2004, now Pat. No. 7,372,539.

(30) Foreign Application Priority Data

Apr. 2, 2003 (DE) ............... 103 15 001

(51) Int. Cl.
*G03B 27/68* (2006.01)
*G03B 27/42* (2006.01)
*G03B 27/58* (2006.01)
*G03B 27/62* (2006.01)

(52) U.S. Cl. ............... 355/52; 355/53; 355/72; 355/75

(58) Field of Classification Search ............... 355/52, 355/53, 72, 75, 77; 430/5, 22, 30
See application file for complete search history.

(56) References Cited

U.S. PATENT DOCUMENTS

| | | | |
|---|---|---|---|
| 5,117,255 A | 5/1992 | Shiraishi et al. | |
| 5,739,899 A | 4/1998 | Nishi et al. | |
| 5,945,239 A | 8/1999 | Taniguchi | |
| 6,262,792 B1 | 7/2001 | Higashiki | |
| 6,359,678 B1 * | 3/2002 | Ota | 355/53 |
| 6,522,386 B1 * | 2/2003 | Nishi | 355/52 |
| 6,549,270 B1 | 4/2003 | Ota | |
| 7,372,539 B2 | 5/2008 | Kirchner et al. | |
| 2001/0040674 A1 | 11/2001 | Suzuki | |
| 2002/0056815 A1 | 5/2002 | Mann et al. | |
| 2002/0191165 A1 | 12/2002 | Baselmans et al. | |

(Continued)

FOREIGN PATENT DOCUMENTS

EP 1 039 510 A1 9/2000

OTHER PUBLICATIONS

Chapman et al., "A Rigorous Method for Compensation Selection and Alignment of Microlithographic Optical Systems", "SPIE vol. 3331," Mar. 25, 1998, Publisher: Lawrence Livermore National Laboratory, Published in: US.

(Continued)

*Primary Examiner*—Alan A Mathews
(74) *Attorney, Agent, or Firm*—Factor & Lake, Ltd.

(57) ABSTRACT

For the correction of anamorphism in the case of a projection lens of an EUV projection exposure apparatus for wafers it is proposed to tilt the reticle bearing the pattern to be projected and preferably also the wafer by a small angle about an axis that is perpendicular to the axis A of the lens and perpendicular to the scan direction and that in each instance passes through the middle of the light field generated on the reticle or on the wafer. For the correction of a substantially antisymmetric quadratic distortion the reticle and/or the substrate is instead rotated about an axis of rotation that is disposed at least approximately parallel to an optical axis of the projection lens.

14 Claims, 10 Drawing Sheets

U.S. PATENT DOCUMENTS

2003/0003383 A1   1/2003   Van Der Werf et al.

OTHER PUBLICATIONS

Descour et al., "Misalignment Modes in High-Performance Optical Systems", "Optical Engineering", Jul. 2000, pp. 1737-1747, vol. 39, No. 7, Publisher: Optical Sciences Center, University of Arizona, Tucson, AR, Published in: US.

Williamson, "Compensator Selection in the Tolerancing of Microlithographic Lens", "SPIE vol. 1049", 1989, pp. 178-186, Publisher: The Perkin-Elmer Corporation, Norwalk, Connecticut, Published in: US.

* cited by examiner

MAX: 2.57571

MAX: 0.22303

METHOD FOR DISTORTION CORRECTION IN A MICROLITHOGRAPHIC PROJECTION EXPOSURE APPARATUS

CROSS REFERENCE TO RELATED APPLICATIONS

This application is a continuation application of U.S. patent application Ser. No. 10/815,116 filed on Mar. 31, 2004, now U.S. Pat. No. 7,372,539, which claims priority to German patent application number 103 15 001.3, filed on Apr. 2, 2003 both of which are incorporated herein by reference.

BACKGROUND OF THE INVENTION

1. Field of the Invention

The invention relates to a method for the correction of certain types of distortion in a projection lens of a microlithographic projection exposure apparatus.

2. Description of the Related Art

In the course of the production of large-scale integrated circuits and other microstructured components, several structured layers are applied onto a suitable substrate which may be, for example, a silicon wafer. With a view to structuring the layers, the latter are firstly covered with a photoresist that is sensitive to light of a particular wavelength range, for example light in the deep ultraviolet (DUV) or extreme ultraviolet (EUV) spectral range. The wafer that has been coated in this way is subsequently exposed in a projection exposure apparatus. In the course of this exposure, a pattern of structures which is located on a reticle is imaged onto the photoresist with the aid of a projection lens. Since the linear magnification in this case is generally less than 1, projection lenses of such a type are frequently also designated as reduction lenses.

After the photoresist has been developed, the wafer is subjected to an etching process or a deposition process, as a result of which the uppermost layer is structured so as to correspond to the pattern on the mask. The photoresist that has been left behind is then removed from the remaining parts of the layer. This process is repeated until all the layers on the wafer have been applied.

One of the main aims in the development of microlithographic projection exposure apparatuses consists in being able to generate structures on the wafer having increasingly smaller dimensions, in order in this way to increase the integration density of the components to be produced. One possible way to achieve this aim consists in improving the imaging quality of the projection lens through the correction of imaging errors.

The causes of imaging errors in projection lenses are varied. Imaging errors that go back to material defects or manufacturing errors are frequently particularly difficult to correct. The same holds for imaging errors that are caused by changes in the optical elements contained in the projection lens and that arise only during operation. In this connection it may be a question, for example, of temporary changes of shape resulting from local heating by the high-energy projection light. The projection light may also interact directly with the material from which the optical elements are made and may, for example, bring about permanent changes therein in the refractive index.

An imaging error that occurs frequently in projection lenses is distortion. This term is to be understood to mean, quite generally, the effect such that structures in the object plane of an optical imaging system are not all imaged onto the image plane with the same linear magnification. Although this does not impair the sharpness of the image, it has the result that the image is no longer similar to the object in the geometrical sense.

In the mathematical description of distortion the distorted image is generally compared with a required image. For individual image points it is then ascertained to what extent the actual position in the image plane deviates from the required position. These deviations can be described, for example, by vectors that specify the direction and the magnitude of the deviation. These vectors then convey a vivid picture of the distortion.

With the aid of the distortion vectors it is possible for different types of distortion to be described in particularly simple manner. Firstly, it is possible to distinguish between linear distortion, quadratic distortion and higher-order distortion. In the case of a linear distortion, the magnitude of the distortion vectors increases linearly the further they are removed from a particular reference-point which, for example, may be situated in the middle of the image field. In the case of a quadratic distortion, the magnitude of the distortion vectors depends on the product of two position coordinates, for example $x^2$, $y^2$ or $xy$. Corresponding remarks apply in respect of higher-order distortions.

In addition, the distortion may be differentiated in accordance with its symmetry properties with respect to a plane of symmetry of the projection lens, which generally also extends through the middle of the image field and subdivides the latter into two mirror-symmetric halves. Thus the distortion vectors may, for example, be disposed symmetrically with respect to this plane of symmetry in such a way that they pass into themselves again in the event of an imagined rotation of the projection lens by 180°. A linear distortion with such a twofold symmetry is also designated as anamorphism. Anamorphism can also be interpreted visually as an imaging error in which the linear magnification is different in two mutually perpendicular directions. This results in a distortion of the image, with which a circle, for example, is imaged as an ellipse. Amongst the distortions having special symmetry properties, besides the symmetric distortions there are also antisymmetric distortions.

In the case of the quadratic distortions, it is likewise possible to distinguish between symmetric and antisymmetric distortions with respect to the plane of symmetry of the projection lens. In addition, one differentiates further between sagittal and tangential distortion, depending on the directions of the distortion vectors in a polar coordinate system that is centred relative to the optical axis.

By way of measures for the correction of imaging errors, changes in the position of individual optical elements with the aid of manipulators generally enter into consideration, for example. Manipulators of such a type, which are known as such, in particular enable optical elements to be displaced along the optical axis or even perpendicular thereto, to be rotated about the optical axis, or to be tilted perpendicular thereto. A purposeful bending of optical elements has also been proposed.

For the correction of distortion in projection lenses especially it is known to tilt individual optical elements contained therein about a tilt axis perpendicular to the optical axis or to decentre them with respect to the optical axis. The term 'decentring' is understood to mean a translational relocation of the optical element in question in a plane disposed perpendicular to the optical axis. A deformation of individual optical elements for the purpose of correction is also possible.

Certain types of distortion, namely an error in the linear magnification and also quadratic distortion, cannot be corrected by a change in position of the reticle in the case of doubly telecentric projection lenses. Such corrections are only possible if one or more optical elements within the projection lens is/are changed in its/their position. In order, for example, to correct a tangential distortion and a sagittal distortion independently of one another, at least two manipulators have to be present which generate the requisite changes of position. These manipulators are structurally very elaborate and for this reason contribute considerably to the costs of the projection lens, since they have to guarantee a high precision of adjustment over a relatively long traversed path. In this context it is a further disadvantage that, by virtue of the change in position of optical elements, as a rule other imaging errors are generated which entail further correction measures.

SUMMARY OF THE INVENTION

For the above reasons the object of the invention is to specify methods for the correction of certain types of distortion in a projection lens of a microlithographic projection exposure apparatus, said methods requiring particularly few and simply constructed manipulators.

This object is achieved, according to a first aspect of the invention, by a method that presupposes a projection lens, which is non-telecentric on the object side, of a microlithographic projection exposure apparatus, the image field of which is disposed extra-axially. With this projection exposure apparatus, a pattern contained in a reticle is capable of being imaged on a substrate of a light-sensitive layer. For the correction of a substantially linear distortion with twofold symmetry (anamorphism), the reticle is tilted about a tilt axis which is disposed at least approximately perpendicular to an optical axis of the projection lens and preferably also to a scan direction along which the reticle is traversed opposite the projection lens at a first relative velocity during a projection.

Imaging systems designated as telecentric on the object side are those, the entrance pupil of which is situated at least approximately at infinity. For this reason, a projection lens that is telecentric on the object side has the property that comparatively small relocations of the object along the optical axis out of the object plane impair the imaging only relatively slightly.

The invention is based on the consideration that, in the case where the projection lens is not telecentric on the object side, such a tilting of the reticle about an axis perpendicular to the optical axis generates a compensating distortion which is quadratic and symmetric. Within the small extra-axial field region in the image plane this compensating distortion resembles, to a high degree, the distortion to be corrected—at least after a suitable decentring of the wafer in the image plane—with regard to the magnitudes and the directional distribution of the distortion vectors. Consequently, by tilting of the reticle an imaging error can be corrected which, in the case of projection lenses that are telecentric on the object side or projection lenses having an axially centred field region, would not be capable of being corrected solely by virtue of a small change in position of the reticle.

This possibility of distortion correction can consequently influence the considerations as regards whether the projection lens is designed to be telecentric or non-telecentric on the object side and whether an axial or extra-axial image field is to be utilised.

However, projection lenses that are non-telecentric on the object side and that image patterns contained in a reticle onto an extra-axial field region in the image plane are the rule in the case of purely reflective projection lenses. Projection lenses of such a type are mostly designed for wavelengths that lie within the extreme ultraviolet spectral range (EUV) and that amount, for example, to about 13 nm. In the case of EUV projection exposure apparatuses the projection lenses are, as a rule, non-telecentric, for the reason that the reticle cannot be transilluminated but is instead illuminated obliquely from the side by a beam of projection light. The invention can consequently be employed in such EUV projection exposure apparatuses in a particularly advantageous manner.

By virtue of this relatively simple measure, namely the tilting of the reticle about an axis perpendicular to the optical axis, a considerable reduction of a merit value characterising the imaging quality can be achieved, as will be explained in detail further below. In a practical exemplary embodiment this reduction may amount to 56%.

Another distinct reduction of the anamorphic distortion is obtained when, in addition to the tilting of the reticle and the wafer, the linear magnification of the optical system is also varied. By this measure, a lowering of the merit value down to about 25% of the initial value is possible in one example.

Alternatively, or in addition, by changing the position and/or orientation of one or more of the components of the projection exposure apparatus, which comes in addition to the tilting of the reticle and, in appropriate circumstances, of the wafer, the distortion can be reduced again. The components of the projection exposure apparatus mentioned here are to be understood as being the imaging elements of the lens (mirror), but also the reticle and the wafer.

Such changes of position are preferably a displacement parallel to the optical axis, a movement in the scan direction and a tilting movement about an axis that is perpendicular to the optical axis and perpendicular to the scan direction.

If the reticle is tilted about an axis perpendicular to the optical axis, this also results in a tilting of the image plane, the tilt angle thereof being reduced in magnitude by the linear magnification. It is therefore preferred if the wafer is transported into the tilted image plane by the wafer being tilted about another tilt axis that extends parallel to the tilt axis about which the reticle is tilted.

Other further developments of the invention are characterised in that the lens exhibits at least one mirror and, again preferably, at least six mirrors, and again preferably is a lens comprising only mirrors. If compensating movements are performed for a plurality of the components of the lens, the merit function for the distortion can again be improved. However, fourth, fifth and sixth compensating movements yield only relatively small contributions to the reduction of the merit function.

One further development of the invention is characterised in that the tilt angle of the reticle, in appropriate circumstances the tilt angle of the wafer and, again in appropriate circumstances, in addition compensating movements of components of the lens are obtained by minimising a merit function that is ascertained on the basis of one or more of the following variables: distortion, field curvature, coma, spherical aberration, astigmatism, scale errors of the lens.

According to another aspect of the invention, a quadratic distortion that is substantially antisymmetric relative to a plane of symmetry of the projection lens is corrected in an extra-axial field region of an image plane of a projection lens, by the reticle and/or the substrate of the light-sensitive layer being rotated about an axis of rotation that is disposed at least approximately parallel to an optical axis of the projection lens.

As a result of such a rotation of the reticle and/or of the substrate about an axis of rotation parallel to an optical axis, an antisymmetric linear distortion is generated. In a small extra-axial field region of the image plane an antisymmetric quadratic distortion that is already present, to be specific both the tangential distortion and the sagittal distortion, is very similar—at least after a suitable decentring of the wafer in the image plane—to an antisymmetric linear distortion generated by rotation the reticle and/or the wafer. This permits an imaging error to be corrected by manipulation of the reticle, which in the case of a projection lens that is telecentric on the object side with an axial field region could only be corrected by manipulations of the optical elements contained in the projection lens. The advantages mentioned above in connection with the correction of anamorphism apply here correspondingly.

In other respects it is immaterial whether only the reticle, only the wafer or both components is/are rotated about axes parallel to the optical axis.

In this connection it is advantageous, in particular, that two image errors differing as such, namely both the tangential distortion and the sagittal distortion, can be corrected with only a single manipulator which brings about the rotation of the reticle or of the wafer about the axis parallel to the optical axis.

Advantageous furthermore with this type of distortion correction is the fact that the rotation of the reticle and/or of the wafer that has been described only has an effect on the distortion and does not generate any other image errors which in turn would have to be corrected.

Favourable, in addition, is the high degree of sensitivity with which the distortion can be influenced by a rotation of the reticle and/or of the wafer. As a consequence of this, relatively large distortions can be corrected with very short regulating distances. The manipulators that are required for this therefore have to operate with high precision only over a comparatively short traversed path and for this reason can be made available at a clearly more favourable cost. For this reason, the invention also provides a projection lens of a microlithographic projection exposure apparatus having a manipulator with which, for the correction of a substantially antisymmetric quadratic distortion, a reticle and/or a substrate is/are capable of being rotated about an axis of rotation that is disposed at least approximately parallel to an optical axis of the projection lens, the ratio of the correction of the distortion to the angle of rotation generated by the manipulator being greater than 1.5 nm/µrad.

It is preferred if the axis of rotation is situated in a plane of symmetry of the projection lens in which the optical axis also extends. This is normally also the plane of symmetry of the distortion within the extra-axial field region.

The further developments listed above in connection with the correction of anamorphism, to be specific particularly with regard to the possibility of achieving a further improvement of the correction by additional changes in position of the optical components contained in the projection lens, apply here correspondingly.

BRIEF DESCRIPTION OF THE DRAWINGS

The invention will be elucidated in greater detail below on the basis of exemplary embodiments with reference to the drawing. Shown in the latter are.

DESCRIPTION OF PREFERRED EMBODIMENTS

Figure 1:
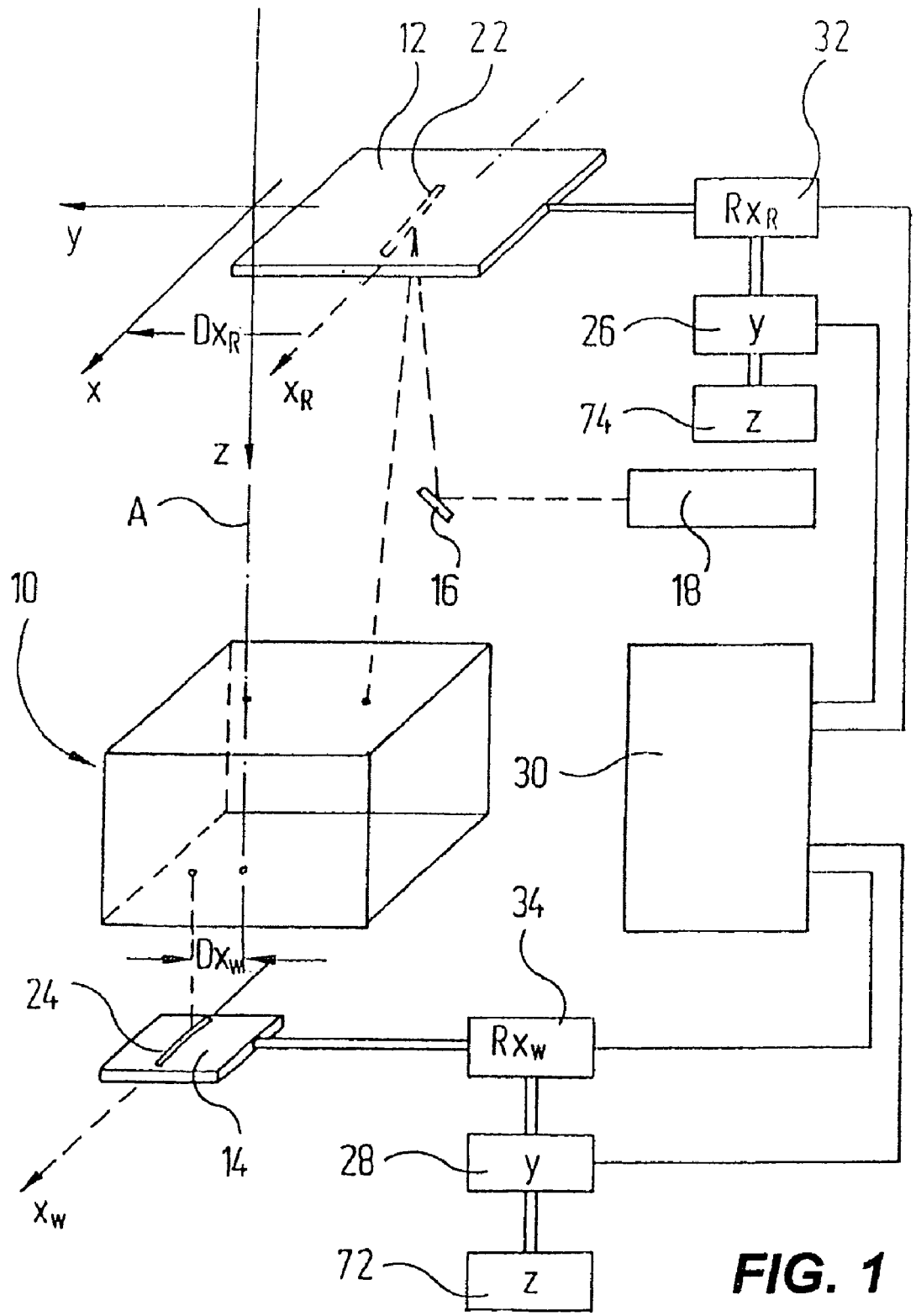
FIG. 1 a schematic representation of an EUV projection exposure apparatus according to a first exemplary embodiment.

In FIG. 1 a projection lens is represented schematically at 10 in the form of a box. The projection lens has an optical axis A and comprises several mirrors, as will be elucidated more precisely later with reference to FIG. 2. The projection lens 10 serves to image a pattern on an underside of a reticle 12 pointing downwards in FIG. 1 onto one side of a wafer 14 pointing upwards in FIG. 1. The wafer bears a layer, a photoresist for example, that is sensitive to projection light, the wavelength of which lies within the ultraviolet spectral range (EUV). The projection light is generated by an illumination system 18 from synchrotron radiation or plasma discharge sources (laser-induced or induced by gas discharge) and may, for example, have a wavelength of about 13 nm.

The projection light generated by the illumination system 18 is cast onto the underside of the reticle 12 via a reflecting mirror 16. An illuminated fringe 22 having the form of a circular arc is formed there. The angular extent of the fringe 22 is adapted to the width of the pattern on the reticle 12 to be imaged and may amount to 60°, for example.

The projection light reflected from the underside of the reticle 12 passes through the projection lens 10 and generates on the upper side of the wafer 14 a light stripe 24 which is an image of the fringe 22 illuminated on the reticle 12.

In FIG. 1 a Cartesian coordinate system is reproduced which will be used below for the purpose of describing various movements. In this connection Dx stands for a small movement in the x-direction, and Rx stands for a small rotation about an axis parallel to the x-axis.

The z-axis of the coordinate system extends in the direction of the optical axis A from the reticle 12 to the wafer 14. The x-axis extends parallel to the line connecting the ends of the illuminated fringe 22; the y-axis extends perpendicular to the illuminated fringe 22, through the middle thereof. The y-direction represents at the same time the direction in which the reticle is traversed opposite the projection lens 10 during a scan operation. In the following the y-direction is therefore designated as the scan direction.

In order to transmit the entire pattern borne by the reticle 12 onto the wafer 14, the reticle 12 is provided with a drive 26 which is only drawn schematically and which moves the reticle 12 in the y-direction in the x-y plane. Correspondingly, the wafer 14 is connected to a drive 28 which is likewise only indicated schematically and which moves the wafer 14 in the y-direction in a plane parallel to the x-y plane.

The drives 26 and 28 are controlled by a control unit 30 which controls the two drives 26, 28 electrically in such a way that the speeds of the y-movements of the reticle 12 and of the wafer 14 are in the proportion of the linear magnification β of the projection lens 10. The orientation of the y-movements is in the opposite sense, since the projection lens 10 generates an image inversion. If the projection lens 10 does not generate an image inversion, the reticle 12 and the wafer 14 should be traversed along the scan direction y with the same orientation.

The drives 26 and 28 act via tilting drive units 32, 34 on the reticle 12 and on the wafer 14, respectively, and are in turn borne by a system frame, which is not reproduced in the drawing, via further drive units 74 and 72 acting in the z-direction.

The drive unit 32 is designed in such a way that it is able to tilt the reticle 12 about an axis $x_R$. The latter extends parallel to the x-axis in the plane of the underside of the reticle 12 (object plane) and through the middle of the fringe 22 which the light source 18 generates on the reticle 12.

The drive unit 34 is correspondingly designed in such a way that it is able to swivel the wafer 14 about an axis $x_w$, which likewise extends parallel to the x-direction, lies in the plane (image plane) predetermined by the upper side of the wafer 14 and intersects the middle of the light stripe 24.

The drive links which are represented schematically by lines should be understood as being logical only. The directions of the drive links shown in the drawing differ predominantly from the true directions.

The drive units 32, 34 for the tilting movements of the reticle 12 and of the wafer 14 are likewise controlled by the control unit 30, to be specific in such a way that the amplitudes of their drive movements correspond to the linear magnification of the projection lens 10, the directions of swivel being opposing.

In a modification of this arrangement, the tilt angles of the planes of motion of the carriages of the drives 26 and 28 may also be permanently predetermined by appropriate adjustment of bearing plates for the reticle 12 and the wafer 14, respectively, if an adaptation to altered conditions in ongoing operation is not required.

Figure 2:
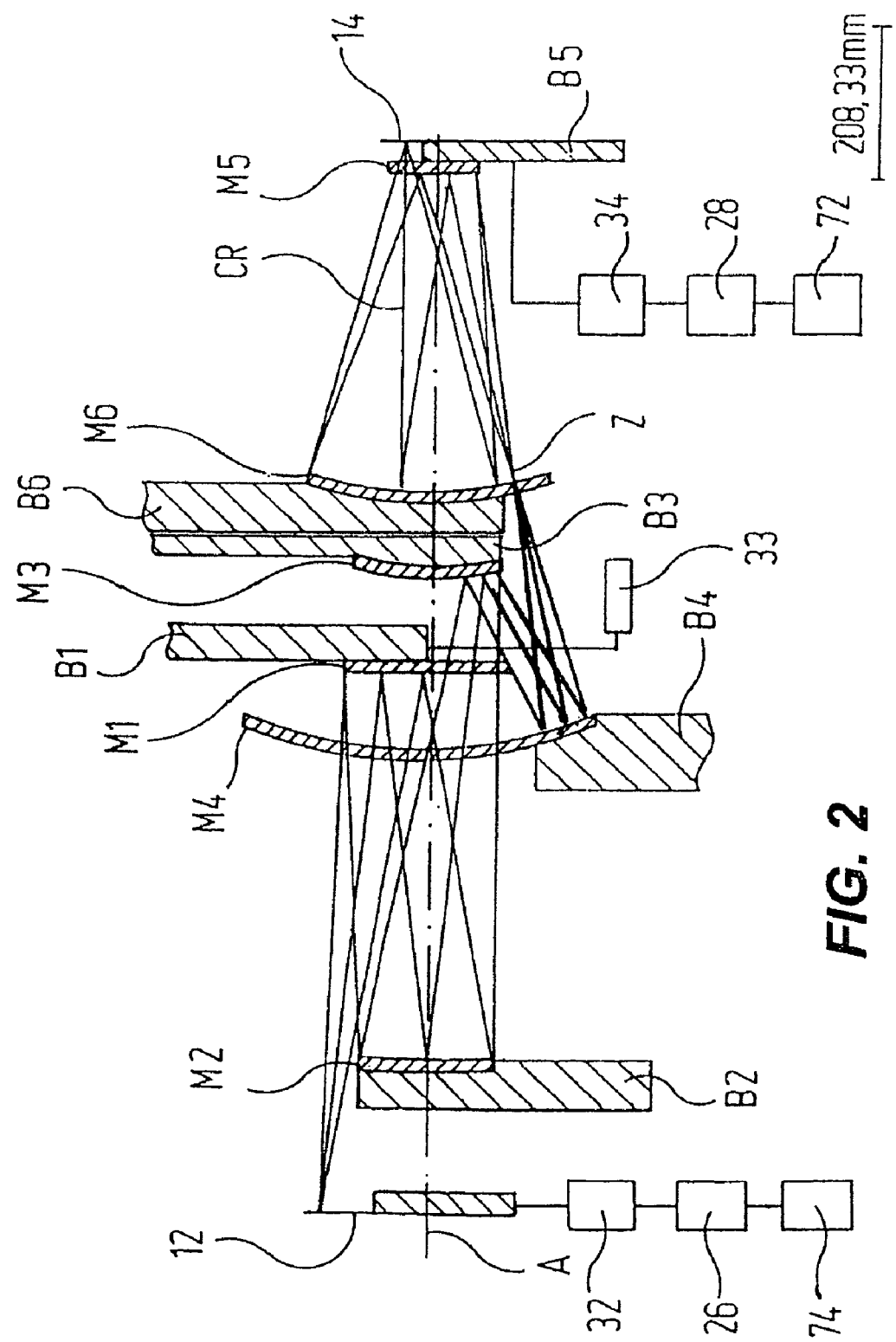
FIG. 2 a schematic representation of a projection lens that is part of the projection exposure apparatus shown in FIG. 1.

FIG. 2 shows details of the projection lens 10 which comprises six mirrors M1, M2, M3, M4, M5, M6 by way of imaging components. The reflecting faces of said mirrors are arranged coaxially with the optical axis A.

The mirrors M1 to M6 are reproduced in the drawing as components that are rotationally symmetrical relative to the optical axis A. It will be understood that these mirrors M1 to M6 are, in reality, only present in the regions that are also really utilised by the optical path; the remaining regions have to remain vacant, in order not to impede the optical path. The mirrors M1 to M6 are arranged on base elements B1 to B6 assigned to them. Said base elements, besides performing a bearing function, may perform other functions; for example, they may provide for temperature stabilisation of the mirrors M1 to M6 and may provide construction space that is needed for such functions.

In the case of the projection lens under consideration here, at least one of the mirrors M1 to M6 is capable of being displaced by small distances in the z-direction and/or y-direction or capable of being tilted by small angles about an axis parallel to the x-axis. For the mirror M1 a corresponding z-alignment means or a corresponding z-actuator is indicated in the drawing at 33.

Figure 3:
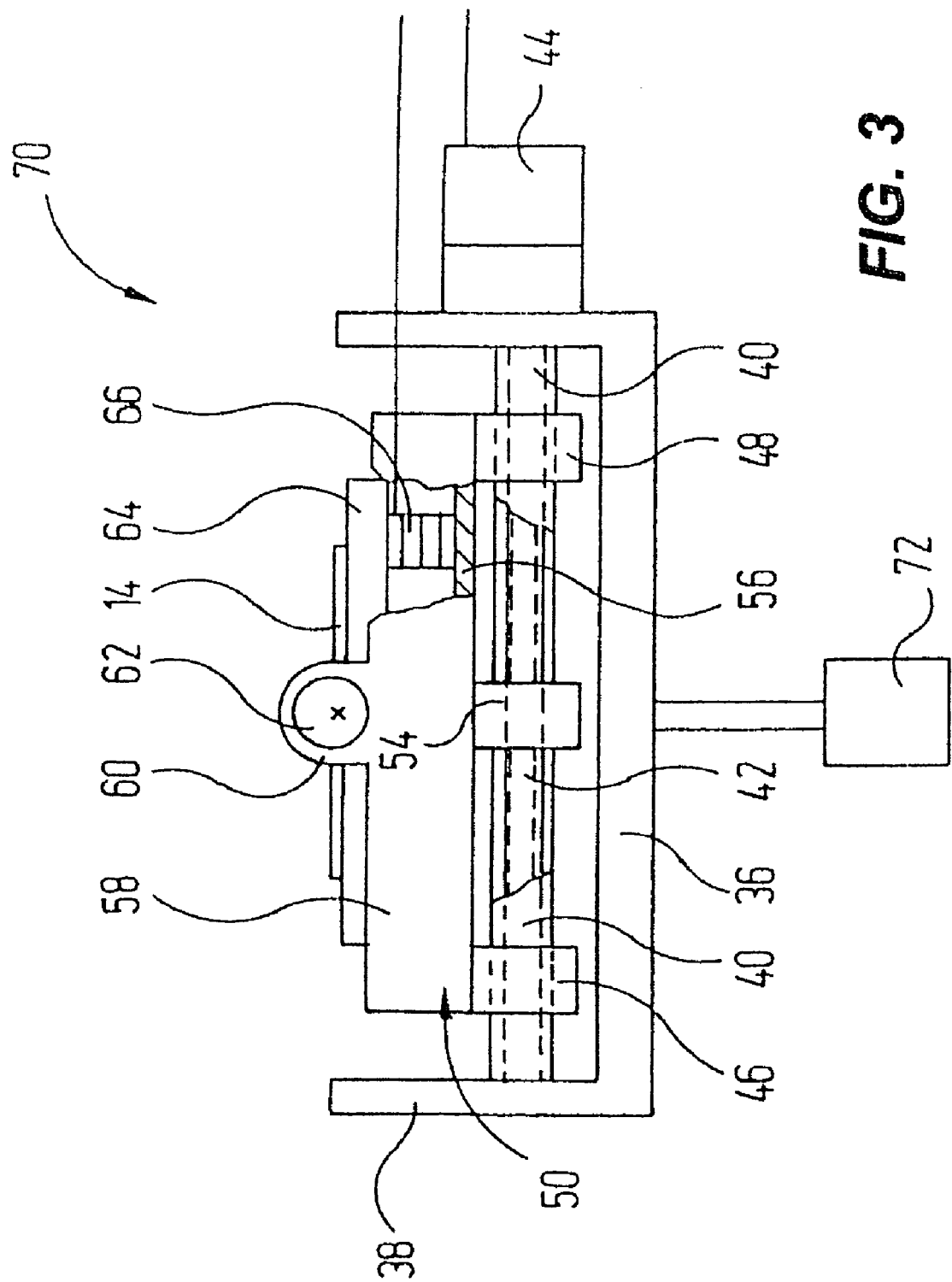
FIG. 3 a schematic representation of the bearing arrangement of a carriage that is used in the projection exposure apparatus according to FIG. 1 for the purpose of holding and moving the wafer.

FIG. 3 shows a possible embodiment of a holder for the wafer 14. A base plate 36 is provided with walls 38 at its ends. In said walls the ends of two parallel lateral guide rods 40 are fastened. In parallel a threaded spindle 42 which is driven by a geared motor 44 which is seated on one of the walls 38 extends between the two guide rods 40.

A guide carriage 50 with four guide lugs 46 hanging down adjacent to the corners of the base plate 36 runs on the guide rods 40. A threaded lug 54 hanging down near the middle of the base plate 36 rotates on the threaded spindle 42. The aforementioned elements 36 to 54 constitute the y-drive 28.

The guide carriage 50 has a baseplate 56 and lateral cheeks 58 which are provided in their middle with bearing lugs 60. Supported in the bearing lugs 60 are stub shafts 62 which are permanently connected to a bearing plate 64. On the latter the wafer 14 is releasably fastened by means which are not shown in any detail. The position of the stub shafts 62 is chosen so that the axis thereof, which under operational conditions extends parallel to the x-axis, is situated in the plane predetermined by the surface of the wafer 14.

The bearing plate 64, which as described above is supported so as to be capable of swivelling, is supported on the baseplate 56 via an actuator 66, which may be a piezoelectric actuator. The aforementioned elements 56 to 66 constitute the $Rx_w$ drive unit 34.

The geared motor 44, which may comprise a gear mechanism and a stepping motor, and also the actuator 66 are connected to the control unit 30 via control lines. The components described above together constitute a wafer stage designated by 70. The latter is integrated within the projection exposure apparatus in such a way that the guide rods 40 extend parallel to the y-direction and the axes of the stub shafts 62 extend in the $x_w$-direction.

It will be discerned that, by reason of this arrangement and the structure of the wafer stage 70 which has been described, it is possible to rotate the wafer 14 in controlled manner about the $x_w$-axis and to displace it in the y-direction.

In addition, the base plate 36 is supported via the actuator 72, which acts in the z-direction, on a component that is fixed with respect to the frame and that is likewise connected to the control unit 30 via a control line. This enables the wafer 14 to be moved also in the z-direction.

In a modification of the aforementioned exemplary embodiment, the rotary support of the bearing plate 64 on the guide carriage 50 can also be undertaken by using torsion elements, since the amplitude of the swivelling movement to be generated about the axis $x_w$ is only small and may, for example, be of the order of magnitude of a few μrad.

For the purpose of holding and moving (in translation and in rotation) the reticle 12, a reticle stage is provided which is of a design analogous to the wafer stage 70 shown in FIG. 3 and consequently does not need to be described in detail once again. The drive unit 32 and its bearing arrangement on the system frame may accordingly be as described above for the drive unit 34. The only difference is that the reticle 12 is then suspended on the underside of the bearing plate 64. The overall dimensions and the y-displacement of the drive unit 32 must, of course, turn out to be larger, according to the linear magnification of the projection lens 10.

As a rule, the projection lenses that are used in the course of the lithographic exposure of wafers under operational conditions have distortions which may be caused by manufacture or by use. Distortions caused by use may, for example, be attributable to the thermal expansion of mirrors in operation, to the deformation of mirrors by mechanical stresses such as are generated in the course of manufacture, in the course of assembly or as a result of the operation of manipulators acting on the mirrors or alternatively also as a result of the degradation of reflecting surfaces in operation.

In the following it will be assumed that the projection lens 10 generates an anamorphic distortion. This expression is understood to mean a linear distortion with twofold symmetry with respect to an arbitrary point in the image plane, as is shown in FIG. 4.

Figure 4:
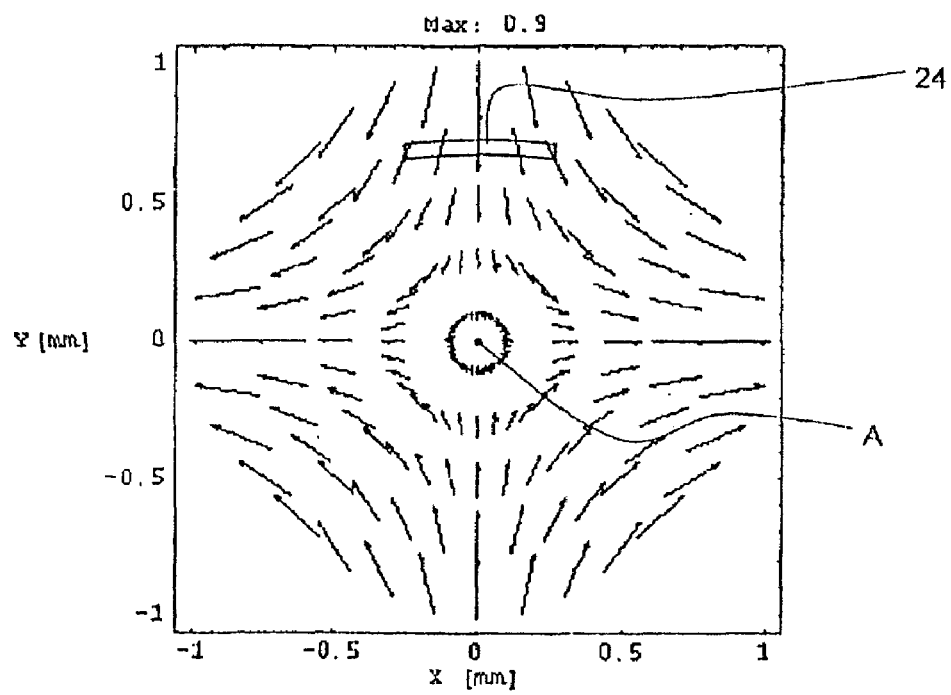
FIG. 4 a diagram for the purpose of elucidating anamorphic distortion.

In the graph of FIG. 4, distortion vectors having components (dx, dy) have been plotted which for selected points (x, y) in the image plane of the projection lens specify in which direction and by which magnitude these points are relocated as a consequence of the distortion. Since the overall available image field measures several centimeters in the x- and y-directions, the distortion, viewed relatively, is in fact relatively slight, since the image points are relocated by at most a few fractions of a millimeter as a consequence of the distortion in the image plane. However, such an imaging is simply no longer able to meet the high demands in terms of imaging quality that are made by projection exposure apparatuses.

A distortion is described as symmetric if for all points (x,y) in the image field the following relationships hold for the components dx and dy of the distortion vectors:

$$dx(-x,y)=-dx(x,y)$$

$$dy(-x,y)=dy(x,y)$$

A distortion is described as antisymmetric if for all points (x,y) in the image field the following relationships hold for the components dx and dy of the distortion vectors:

$$dx(-x,y)=dx(x,y)$$

$$dy(-x,y)=-dy(x,y)$$

If the field distribution cannot be assigned to either of these categories, the distortion is described as asymmetric.

If the distortion vector is specified in polar coordinates, then the anamorphic, i.e. linear antisymmetric, distortion can be specified by distortion vectors of the form $$dr = a\cos 2\phi + b\sin 2\phi$$

$$d\phi = -b\cos 2\phi + a\sin 2\phi$$

where dr is the radial component and dϕ is the tangential component of the distortion vector, a and b denote real constants of the distortion vector, and ϕ denotes the angle of the polar-coordinate system.

In FIG. 4 it can be discerned that along the x-direction and the y-direction the magnitude of the distortion, i.e. the length of the distortion vectors, increases linearly with increasing distance from the origin of the coordinate system, which is situated on the optical axis A. For this reason, it is a question of a linear distortion. Discernible, in addition, is the twofold symmetry of the distortion, since the arrangement of the distortion vectors passes into itself again in the event of a rotation of the diagram by 180°.

In the graph of FIG. 4 there is plotted, in addition, the light stripe 24 which, as can be clearly discerned, extends at a relatively large distance from the optical axis A of the projection lens 10.

Figure 5:
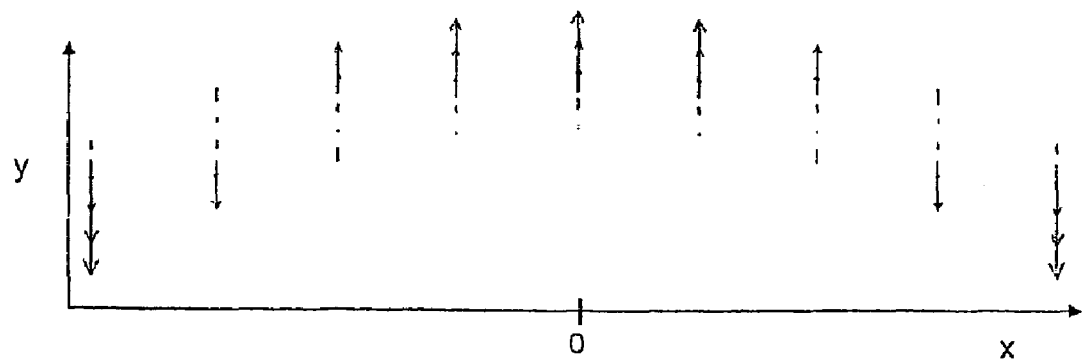
FIG. 5 a schematic representation of a distortion (anamorphism) that increases linearly in the y-direction, on the basis of distortion vectors in the uncorrected state.
Figure 6:
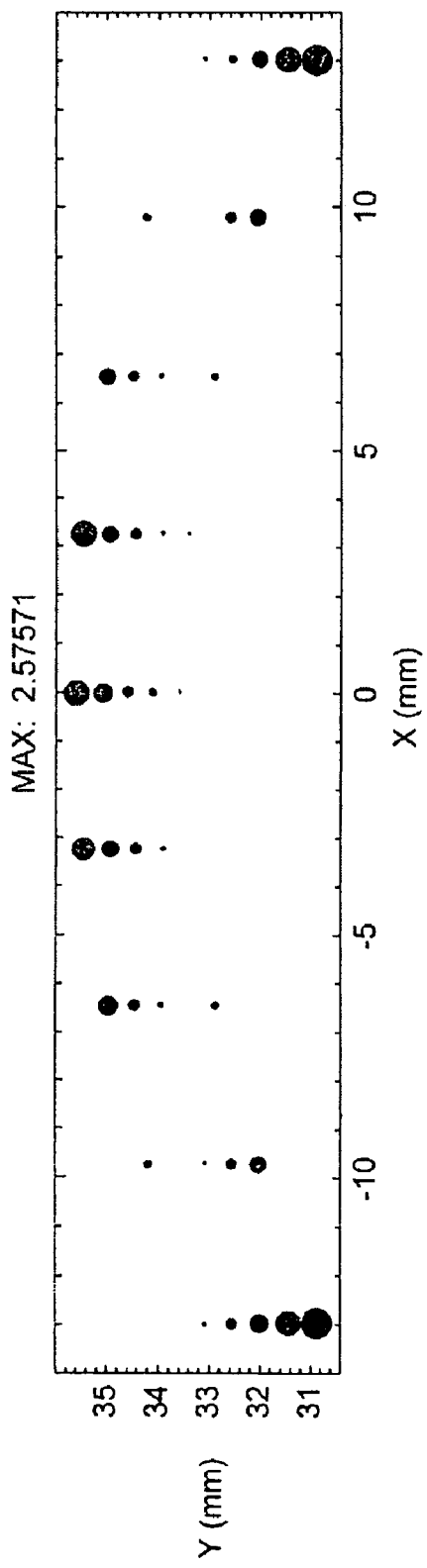
FIG. 6 a schematic representation of the magnitudes of the y-component for the case shown in FIG. 5.

In the following it will be assumed that merely the y-component of the distortion vector increases linearly. The x-component, on the other hand, is to remain constant. This can be obtained, for example, with the aid of an (ideal) manipulator for the linear magnification of the projection lens. For the light stripe 24 in the image plane of the projection lens 10 the relationships shown in FIGS. 5 and 6 are then obtained. FIG. 5 shows the distortion vectors within the image field 24 for selected field points. Since the distortion vectors partially overlap, in FIG. 6 the magnitudes of the distortion vectors are represented on the basis of circles, the radius of which corresponds to the magnitude of the distortion in the y-direction. The zero line of the distortion, which can be freely chosen by displacing the wafer in the y-direction, passes in each instance through the middle of the light stripe 24. The maximal distortion amounts in this example to 2.6 nm, corresponding to 1 ppm. In the x-direction the distortion is zero, as already mentioned.

The illuminated fringe 22 on the reticle 12 is in this case a ring segment that is concentric relative to the optical axis A, with an aperture angle of somewhat less than 60°, with a mean radius of 138 mm and with a width that is small compared with the radius. Hence in the case of a linear magnification of 1:4 of the projection lens 10 a radius of the light stripe 24 on the wafer 14 amounting to 34.5 mm arises.

As has already been mentioned, with the aid of an (ideal) manipulator for the linear magnification of the projection lens any arbitrary anamorphic field distribution having the same symmetry can be generated from the field distribution that is represented. But field distributions that are antisymmetric with respect to the y-axis are not amenable in this way. Typical linear antisymmetric anamorphic field distributions of the distortion are, for example, shears of the image. This can be compensated, at least partly, by rotating the reticle or the wafer about an axis parallel to the optical axis of the projection lens.

With the EUV projection lenses that are customary at the present time, anamorphic field distributions of the distortion arise principally for two reasons, namely surface flaws of the mirrors, and mirror deformations. The latter arise, for example, by virtue of the fact that the fringe-shaped beam of projection light results in a non-rotationally symmetrical heating, and hence in a deformation, of mirrors close to the field. These deformations lead ordinarily, in the case of mirrors close to the field, to imaging errors with twofold symmetry and hence, inter alia, also to anamorphism. With a view to compensation, in the case of projection lenses as such corresponding active deformations of a mirror with the aid of manipulators are required. At least in the case of projection lenses that are telecentric on the object side, there is no genuine alternative to this relatively elaborate type of imaging correction.

In the case of the projection exposure apparatus described above, the projection lens 10 is, however, not telecentric on the object side. Therefore the linear magnification can be influenced by displacing the position of the reticle 12 parallel to the optical axis A. If the reticle 12 is not displaced along the optical axis A in parallel manner overall but is tilted about an axis perpendicular thereto, this results in a field-point-dependent change in the linear magnification. Since this dependency is quadratic with respect to the distance between a field point on the wafer 14 and the image of the tilt axis generated thereon, overall the tilting movement generates a quadratic tangential distortion in the image plane. In the case of the tilting, described above, of the reticle 12 about the tilt axis $x_R$ parallel to the x-axis this distortion is symmetric, this being elucidated in greater detail further below in connection with another exemplary embodiment.

Since the light stripe 24 has only a small extent in the y-direction, as a result of the quadratic symmetric distortion that is generated by tilting of the reticle 12 it is possible, with appropriately chosen tilt angle, for the linear symmetric distortion generated by the deformation of the mirror to be compensated approximately. Here, finally, the fact is exploited that in the case of values of y in the vicinity of 1 it holds that $$y \approx y^2.$$

Figure 7:
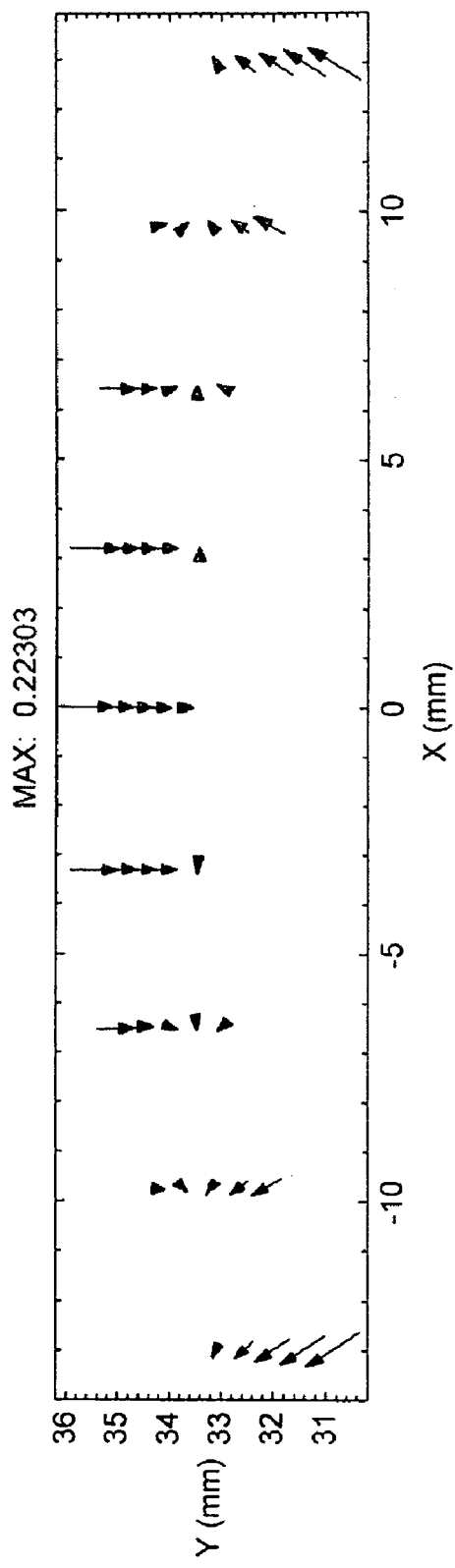
FIG. 7 a representation of the distortion vectors for the distortion that is generated by a tilting of the reticle and the wafer, the reticle being rotated by 1 µrad about the axis $x_R$, and the wafer being tracked at the same time in the y- and z-directions.

The approximately linear symmetric distribution of the distortion that is generated in the light stripe 24 by the tilting of the reticle 12 about the $x_R$-axis by 1 μrad is shown in FIG. 7 in a representation based on FIG. 5. A defocusing associated with the tilting of the reticle 12 is already compensated by a translational relocation of the reticle 12 along the optical axis A. A lateral displacement is balanced out by a relocation in the y-direction.

In FIG. 7 it can be discerned that the magnitude of the distortion, which is indicated by the length of the arrows, increases approximately linearly in y the further one departs from the reference plane in which the distortion as a consequence of translational displacement of the wafer 14 in the x-y plane is zero. This distortion, which is generated due to the tilting, consequently corresponds approximately in terms of magnitude to the anamorphism to be corrected. Given appropriate choice of the direction in which the reticle 12 is tilted, it is possible to ensure that the distortion is substantially contrary in terms of direction, so that a good compensation is achieved by reason of the similar magnitudes.

The linear distribution of the distortion dy in the y-direction also results from the following Table 1, in which the components of the distortion vectors (dx, dy) for selected field points (x, y) have been collated.

In FIG. 7 it can further be discerned that by virtue of the tilting $Rx_R$ of the reticle 12 about the axis $x_R$ another x-component of the distortion arises which cannot be used for the correction of anamorphism. Therefore the correction potential that lies in a tilting of the reticle 12 about the axis $x_R$ is limited.

TABLE 1

Distortion for selected field points in the case of tilting of the reticle by 1 μrad

| x-coordinate [nm] | y-coordinate [nm] | dx [nm] | dy [nm] |
|---|---|---|---|
| 0.0 | 33.5 | 0.0 | −0.02 |
| 0.0 | 34.0 | 0.0 | −0.07 |
| 0.0 | 34.5 | 0.0 | −0.12 |
| 0.0 | 35.0 | 0.0 | −0.17 |
| 0.0 | 35.5 | 0.0 | −0.22 |
| 13.0 | 30.9 | 0.14 | 0.22 |
| 13.0 | 31.4 | 0.12 | 0.18 |
| 13.0 | 32.0 | 0.10 | 0.13 |
| 13.0 | 32.5 | 0.08 | 0.08 |
| 13.0 | 33.0 | 0.06 | 0.03 |

If the reticle 12 is tilted, the best focusing plane for the image that is generated on the upper side of the wafer 14 also tilts. This can be countered by the bearing plate 64 bearing the wafer 14 also being tilted, permitting the arrangement described above with reference to FIG. 3. In this case the ratio of the tilt angle $\alpha_w$ of the wafer 14 to the tilt angle $\alpha_R$ of the reticle 12 is chosen to be equal to the linear magnification β of the projection lens:

$$\alpha_w = \beta \cdot \alpha_R$$

Furthermore, the distances $Dx_R$ and $Dx_w$ between the tilt axis $x_R$ and $x_w$, on the one hand, and the optical axis A of the projection lens, on the other hand, is chosen as follows:

$$Dx_R = \beta \cdot Dx_w.$$

Figure 8:
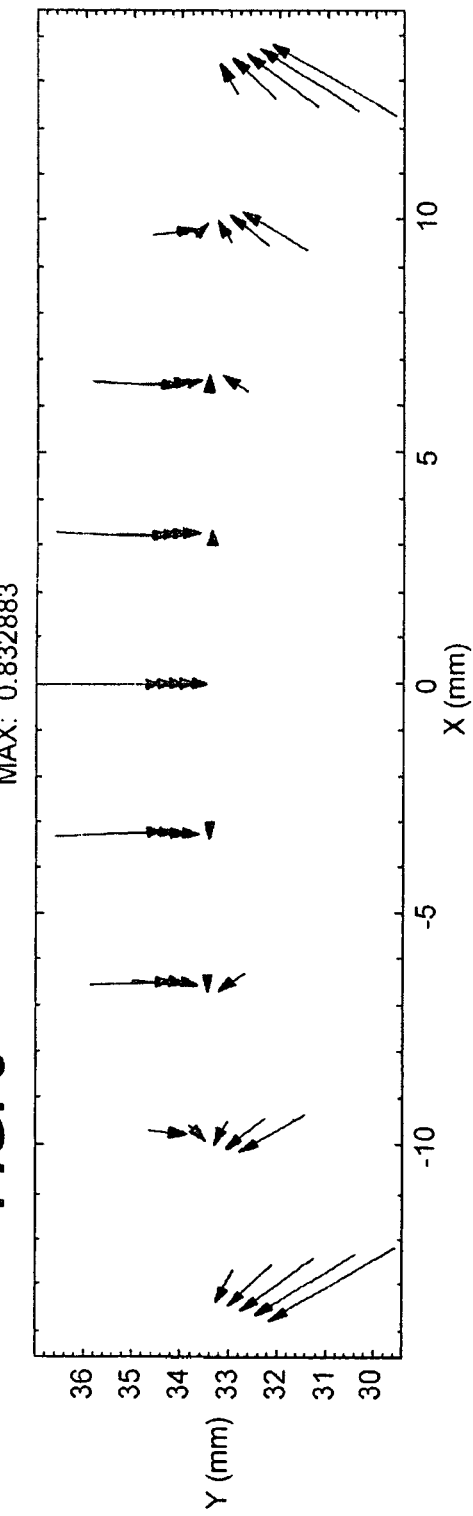
FIG. 8 a diagram similar to that of FIG. 7, the reticle being rotated by 4 µrad about the axis $x_R$, and the wafer being rotated by 1 µrad about the axis $x_w$, and the wafer being tracked at the same time in the y- and z-directions.

FIG. 8 and also Table 2 show, by way of example, the relationships in the event of tilting of the reticle stage by a larger angle than in Table 1, namely 4 μrad, with simultaneous tilting of the wafer stage by 1 μrad.

Limits to the compensation of the distortion as a result of tilting of reticle and wafer were pointed out above. But by changing other parameters of the overall imaging system it is possible for further improvements to be achieved. If the totality of the various mobile components of the entire projection exposure apparatus (mirrors, reticle stage and wafer stage) is designated in abbreviated manner as a "manipulator", this totality has a large number of variable degrees of freedom. The changes to these degrees of freedom result in changes in the quality of the imaging in different directions. For the observation below, the distortion that is described by distortion vectors (dx, dy), the field curvature (FC), the astigmatism, the coma and the spherical aberration are taken into account. But scale errors of the projection lens would also be conceivable.

From the various image errors a merit function is created, with suitable weighting, which in a single number reflects the various imaging errors, and hence the imaging quality of the projection lens 10, and which can be minimised by methods familiar to a person skilled in the art.

With regard to the compensating distortions, in addition to the aforementioned tilting movements of reticle 12 and wafer 14 about parallels to the x-axis other promising degrees of freedom are the displacements of the mirrors M1 to M6 of the projection lens shown in FIG. 2 parallel to the z-axis and y-axis and also tilting movements of these mirrors about axes parallel to the x-axis. The aforementioned degrees of freedom are given the mirror symmetry of the projection lens 10 with respect to the plane of symmetry of the overall arrangement coinciding with the y-z plane.

TABLE 2

Distortion for selected field points in the case of tilting of the reticle and of the wafer by 4 μrad

| x-coordinate [nm] | y-coordinate [nm] | dx [nm] | dy [nm] |
|---|---|---|---|
| 0.0 | 33.5 | 0.0 | −0.06 |
| 0.0 | 34.0 | 0.0 | −0.26 |
| 0.0 | 34.5 | 0.0 | −0.46 |
| 0.0 | 35.0 | 0.0 | −0.67 |
| 0.0 | 35.5 | 0.0 | −0.89 |
| 13.0 | 30.9 | 0.57 | 0.89 |
| 13.0 | 31.4 | 0.48 | 0.71 |
| 13.0 | 32.0 | 0.40 | 0.52 |
| 13.0 | 32.5 | 0.31 | 0.32 |
| 13.0 | 33.0 | 0.23 | 0.12 |

If use is made of the degrees of freedom just mentioned and if for each perturbation and each degree of freedom the position of the image plane is always tracked into the optimal position in each instance, then in the event of enabling of all the degrees of freedom a merit function is obtained which amounts to only 23.2% of the initial value. This is to be compared with the merit function that is obtained solely by tilting of the wafer 14 and of the reticle 12 about the axes $x_w$ and $x_R$, respectively. By virtue of this measure, the merit function can be reduced to less than 48.5% of the initial value.

After an additional lowering of the merit function by about another 25% has already been obtained by adding a single further degree of freedom to the tilting movements of reticle and wafer, the addition of a fourth, fifth or sixth degree of freedom leads only to insignificant further improvements.

Investigations show that the displacement of one of the optical elements of the imaging system in the z-direction presents itself as a third degree of freedom. In this case, with a displacement of the reticle 12 in the z-direction one already comes very close to the result that would be obtained with an ideal manipulator. Very good results are also achieved with a displacement of the mirror M1 or of the mirror M6 in a direction parallel to the z-axis.

Figure 9:
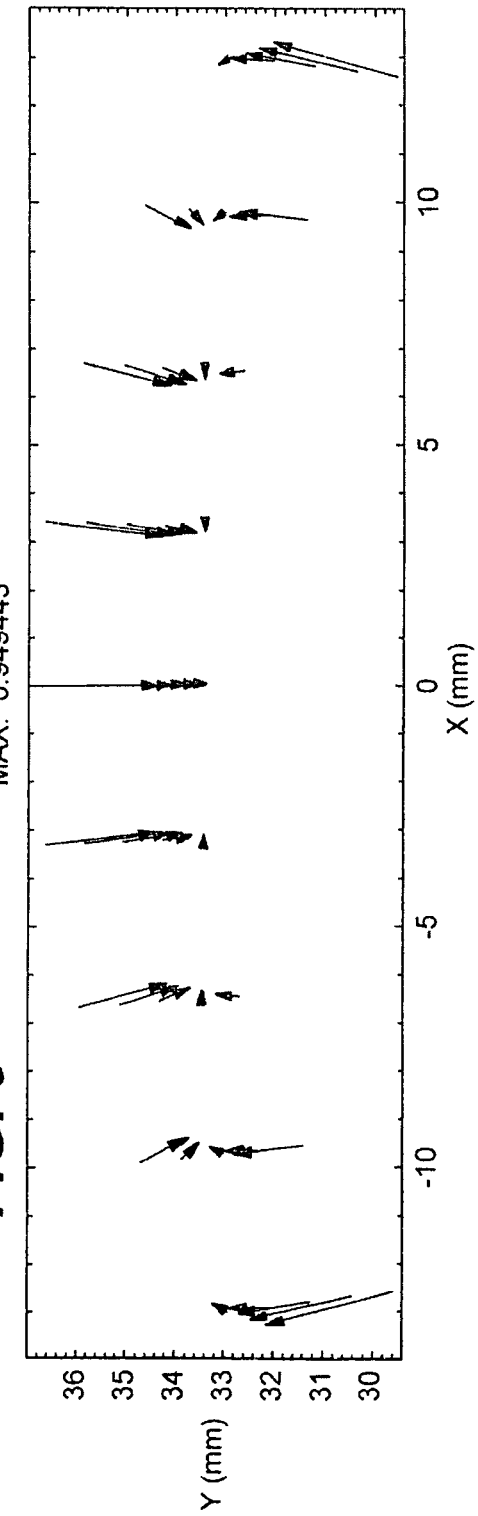
FIG. 9 a diagram similar to that of FIG. 7, the mirror M1 having been additionally displaced by 0.016 µm in the z-direction, and the wafer being tracked at the same time in the y- and z-directions.

FIG. 9 shows, as an alternative, the relationships in the case of additional displacement of the first mirror M1 in the z-direction by the magnitude of 0.016 μm.

From the explanations above it follows that the significant degree of freedom for the correction of anamorphism is the tilting of the reticle about the axis $x_R$.

In the case of the projection lens described above, the field is a long way away from the optical axis. This factor makes it possible to carry out the correction of the anamorphism by tilting the reticle. For a different beam control, in which the field is situated closer to the optical axis, the correction of the anamorphism is poorer. If the spacing of the field is not greater than one half its extent in the x-direction, the x-component of the distortion predominates, and the tilting of the reticle does not yield the desired correction described above.

Figure 10:
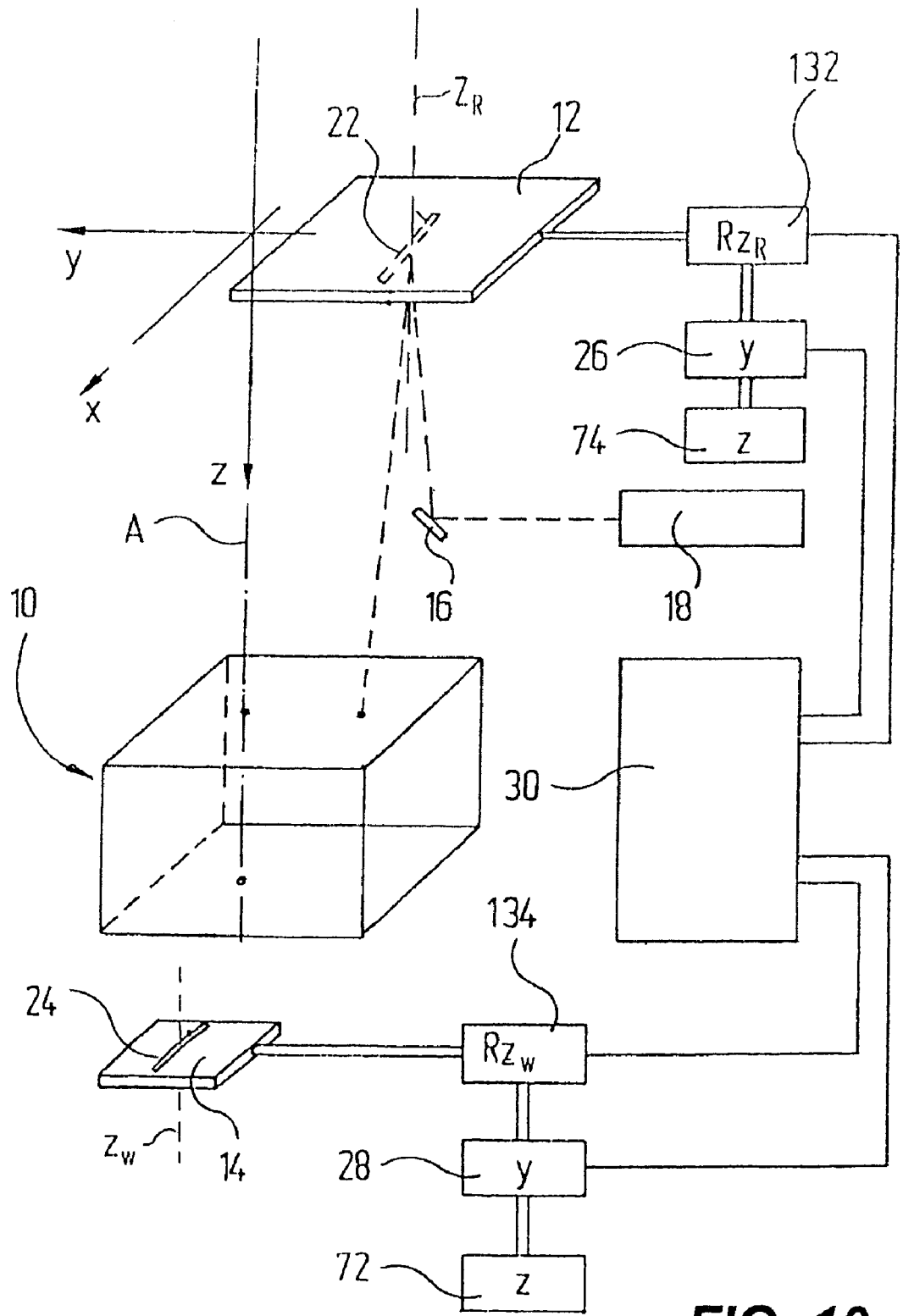
FIG. 10 a schematic representation, corresponding to FIG. 1, of an EUV projection exposure apparatus according to a second exemplary embodiment.

FIG. 10 shows another exemplary embodiment of an EUV projection exposure apparatus in a schematic representation based on FIG. 1. Like components are denoted therein by like reference numerals, and components corresponding to one another are denoted by reference numerals augmented by 100.

The projection exposure apparatus shown in FIG. 10 differs from that shown in FIG. 1 in that the reticle 12 and the wafer 14 are capable of being rotated not about an axis parallel to the x-direction but about an axis $z_R$ and $z_w$, respectively, parallel to the z-direction. The two axes of rotation $z_R$ and $z_w$ extend in this case through the middle of the fringe 22 on the reticle 12 and through the middle of the light stripe 24 on the wafer 14, respectively. With a view to generating the rotary movements of the reticle 12 and of the wafer 14 about the stated axes of rotation $z_R$ and $z_w$, respectively, drives 132 and 134, respectively, are provided which are each connected to the control unit 30.

It will now be assumed that the projection lens 110 generates an antisymmetric quadratic distortion in the image plane in which the wafer 14 is arranged.

In the case of the quadratic distortions one differentiates, on the one hand, in accordance with the symmetry properties such as have already been elucidated above in connection with linear distortion. In addition, depending on the direction of the distortion one distinguishes tangential and sagittal distortions. Overall, four cases of quadratic distortion then arise, namely symmetric tangential distortion, symmetric sagittal distortion, antisymmetric tangential distortion and antisymmetric sagittal distortion. For these four cases the following proportionality relationships hold for the components (dx, dy) of the distortion vectors at the field points (x, y):

Symmetric tangential distortion:
$dx \sim xy$ and $dy \sim y^2$
Symmetric sagittal distortion:
$dx \sim xy$ and $dy \sim -x^2$
Antisymmetric tangential distortion:
$dx \sim x^2$ and $dy \sim xy$
Antisymmetric sagittal distortion:
$dx \sim xy$ and $dy \sim y^2$ FIGS. 11 and 12 respectively show in graphs an antisymmetric tangential distortion and an antisymmetric sagittal distortion in the light stripe 24 on the wafer 14. An image offset which is present in appropriate circumstances has already been compensated therein by displacing the wafer 14. The antisymmetric distribution of the distortion vectors with respect to the plane of symmetry of the projection lens 110, which is given by x=0, can be discerned well in this representation. Furthermore, from FIGS. 11 and 12 it becomes clear that the tangential and the sagittal antisymmetric distortions in the small extra-axial light stripe 24 do not differ significantly from one another.

In order to correct a distortion such as may be brought about by influences similar to those which have already been elucidated above in connection with linear distortion, either the reticle 12 or the wafer 14 is rotated slightly about the axis of rotation $z_R$ or $z_w$, respectively, with the aid of the drive units 132 or 134. Besides this, it is also possible to rotate both the reticle 12 and the wafer 14 about the stated axes.

Figure 13:
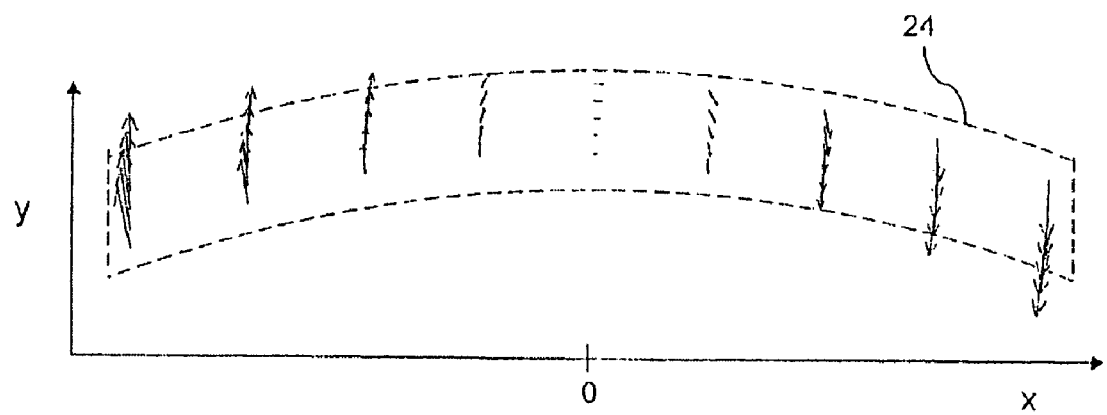
FIG. 13 a representation of the distortion vectors in a light field on the wafer in the case of rotation of the wafer about an axis parallel to the optical axis.

In FIG. 13 a light field 24 is shown such as is generated by the rotation of the wafer 14 about the axis $z_w$ in the absence of an already existing distortion.

Figure 11:
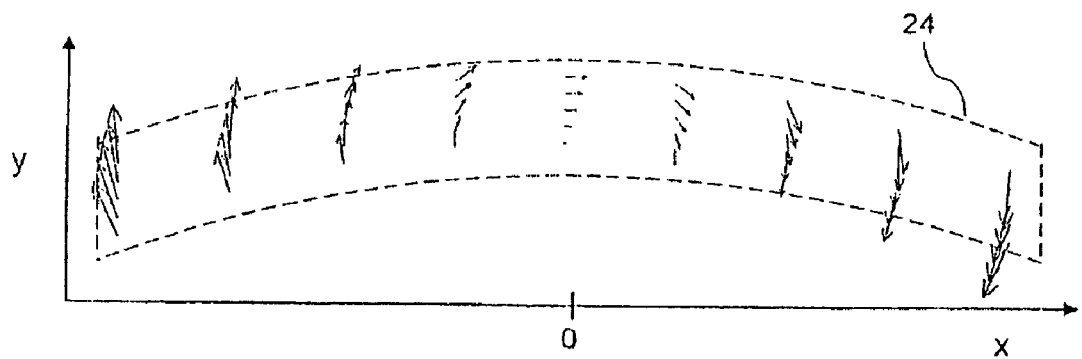
FIG. 11 a representation of the distortion vectors in a light field on the wafer in the case of antisymmetric tangential distortion.
Figure 12:
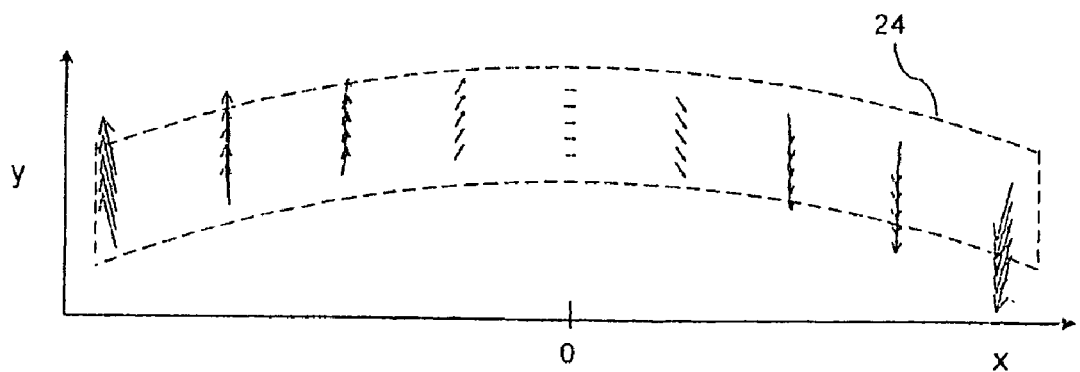
FIG. 12 a representation of the distortion vectors in a light field on the wafer in the case of antisymmetric sagittal distortion.

As a comparison with FIGS. 11 and 12 shows, the distortion that can be achieved by a rotation of the wafer 14 about the axis $z_w$ is very similar to an antisymmetric tangential or sagittal distortion. This is noteworthy, insofar as by virtue of a rotation of the wafer 14 or even of the mask 12 an antisymmetric linear distortion is actually generated. In the narrow extra-axial light stripe 24 the two distortions approximate to one another in such a way that a good compensation is possible.

In principle, it is possible for an antisymmetric tangential or sagittal distortion to be corrected also by changing the position of individual optical elements within the projection lens 110. It has even become evident that the remaining residual errors are smaller in the case of a few such measures than in the case of a rotation of the reticle 12 and/or of the wafer 14. The reason why a rotation of the reticle 12 and/or of the wafer 14 is advantageous nevertheless will be elucidated on the basis of the following concrete example.

Figure 14:
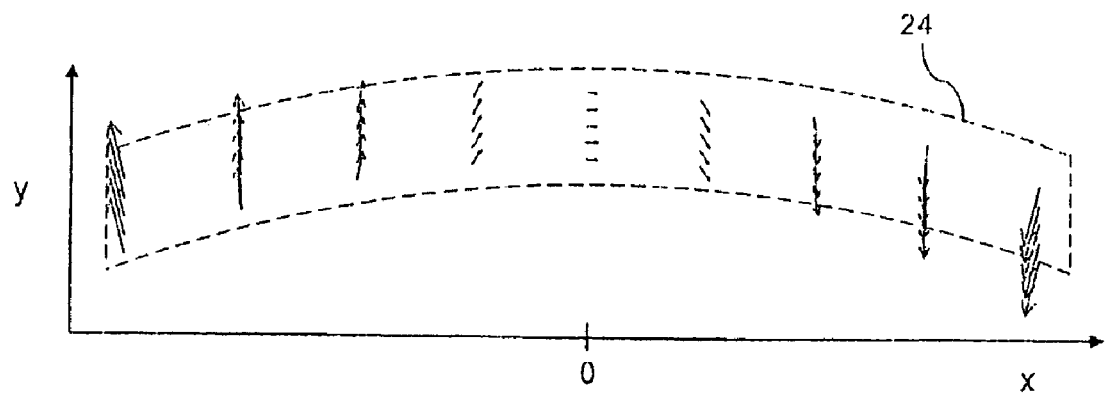
FIG. 14 a representation of the distortion vectors in the case of a distortion caused by rotation of a mirror.

In the following it will be assumed that the second mirror M2 has been decentred as a consequence of an assembly defect within the x-y plane. FIG. 14 shows the distortion in the light stripe 24 that is brought about by this deformation. The wafer 14 in this case has already been displaced along the y-direction in such a way that a field-constant portion of the distortion has been compensated. As a comparison with FIG. 12 shows, in the case of the distortion generated by the deformation of the mirror M4 it is a question substantially of an antisymmetric sagittal distortion which is amenable to a correction by rotation the reticle 12 and/or the wafer 14.

Figure 15:
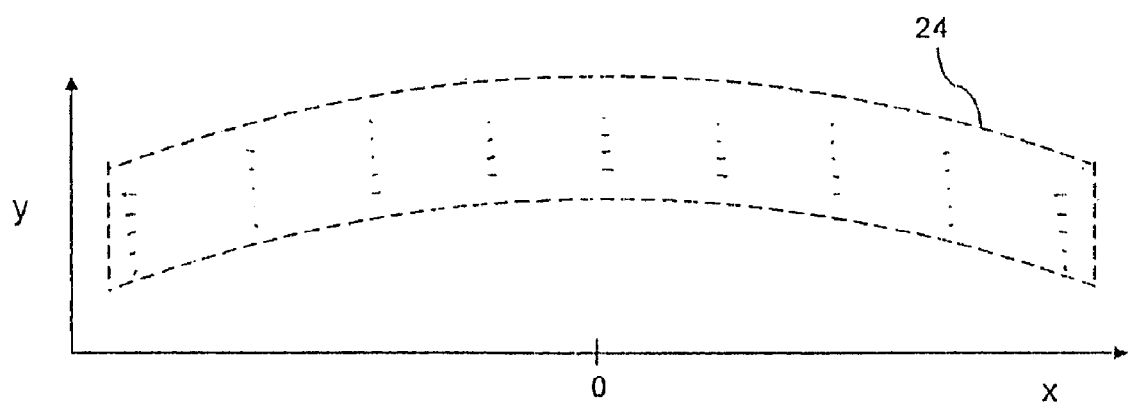
FIG. 15 a representation of the distortion vectors for the case shown in FIG. 14 but after correction by rotation of the wafer about an axis parallel to the optical axis.

FIG. 15 shows for this example the distortion in the light stripe 24 after a rotation of the wafer 14 about the axis $z_w$. As a comparison with FIG. 14 shows, the remaining residual error, which is determined by the length of the distortion vectors, is very small.

For the purpose of comparison of this type of correction with other correction possibilities, in Table 3 it is shown how the different correction possibilities differ from one another with regard to the remaining residual error, the correction achieved, the required focusing paths, the ratio of the achieved correction to the focusing path. The term 'correction' in this connection is understood to mean the extent by which the magnitude of the distortion is diminished by the appropriate correction measure. In the case of the alternative correction measures it is a question, in detail, of a rotation of the first mirror M1 about parallels to the y-axis, a rotation of the reticle 12 about parallels to the y-axis, and a rotation of the second mirror M2 about parallels to the y-axis.

From Table 3 it is evident that, although the rotation of the wafer 14 about the axis $z_w$ enables the poorest correction of the quadratic distortion in comparison with the other stated correction measures, in exchange the ratio of the correction to the requisite focusing path is unusually favourable. This allows the use of comparatively inexpensive manipulators, since the demanded linearity of the focusing path has to be adhered to only over a small regulating range.

A further advantage with the correction described here by rotation the mask 12 and/or the wafer 14 about an axis parallel to the optical axis A is founded on the fact that this rotation acts exclusively on the distortion and otherwise introduces no additional image errors. With the other correction possibilities, on the other hand, although the antisymmetric quadratic distortion is corrected just as well or even better, at the same time additional imaging errors are generated thereby, which generally also have to be corrected. This generally requires a very large number of expensive manipulators, with which the optical elements within the projection lens 110 can be changed in their position or deformed.

TABLE 3

Comparison of different correction measures

| Correction measure | Residual error | Correction achieved | Focusing path | Correction/focusing-path ratio |
|---|---|---|---|---|
| Rotation of the wafer 14 about parallels to the z-axis | 0.21 nm | 0.79 nm | 0.30 μrad | 2.6 nm/μrad |
| Rotation of the first mirror M1 about parallels to the y-axis | 0.06 nm | 0.94 nm | 1.31 μrad | 0.7 nm/μrad |
| Rotation of the reticle 12 about parallels to the y-axis | 0.05 nm | 0.95 nm | 2.82 μrad | 0.3 nm/μrad |
| Rotation of the second mirror M2 about parallels to the y-axis | 0.04 nm | 0.96 nm | 0.92 μrad | 1.0 nm/μrad |

If the remaining residual error of the distortion nonetheless cannot be tolerated, the distortion can be diminished further by addition of a second degree of freedom. For this purpose an additional tilting of the second mirror M2 about a parallel to the x-axis, a tilting of the first mirror M1 about a parallel to the y-axis, or a tilting of the reticle 12 about a parallel to the y-axis enter into consideration, for example. However, the diminution of the residual error that can be achieved by the addition of a second degree of freedom is relatively small and does not generally go significantly beyond about 15%. In most cases this improvement will not justify the additional expenditure on a further manipulator

What is claimed is:

1. A microlithographic projection exposure apparatus, comprising:
   a reticle stage for moving a reticle along a scan direction;
   a wafer stage for moving a wafer;
   a projection lens being non-telecentric on an object side and having
      an optical axis,
      a usable field region that does not contain the optical axis, and
      a substantially antisymmetric quadratic distortion in the field region; and,
   a manipulator which is configured to rotate the reticle, the wafer or both about an axis of rotation that is disposed at least approximately parallel to the optical axis.

2. The apparatus of claim 1, wherein the axis of rotation extends through the field region.

3. The apparatus of claim 2, wherein the axis of rotation lies in a plane of symmetry of the projection lens in which the optical axis also extends.

4. The apparatus of claim 1, comprising a further manipulator which is configured to change the spatial position of at least one optical element contained in the projection lens.

5. The apparatus of claim 4, wherein the further manipulator is configured to displace the at least one optical element parallel to the optical axis.

6. The apparatus of claim 4, wherein the further manipulator is configured to displace the at least one optical element translationally in a plane perpendicular to the optical axis.

7. The apparatus of claim 4, wherein the further manipulator is configured to displace the at least one optical element along the scan direction.

8. The apparatus of claim 4, wherein the further manipulator is configured to displace the at least one optical element perpendicular to the scan direction.

9. The apparatus of claim 4, wherein the further manipulator is configured to tilt the at least one optical element about a tilt axis that is disposed at least approximately perpendicular to the optical axis of the projection lens and to the scan direction.

10. The apparatus of claim 4, wherein the further manipulator is configured to tilt the at least one optical element about a tilt axis that is disposed at least approximately perpendicular to the optical axis of the projection lens and parallel to the scan direction.

11. The apparatus of claim 1, further comprising a device which is configured to change the linear magnification of the projection lens.

12. The apparatus of claim 1, wherein the projection lens comprises only reflective optical elements.

13. The apparatus of claim 12, wherein the projection lens further comprises at least four mirrors.

14. The apparatus of claim 1, wherein the ratio of the correction of the distortion to the angle of rotation generated by the manipulator is greater than 1.5 nm/μrad.

* * * * *